(12) United States Patent
Kim et al.

(10) Patent No.: US 7,322,385 B2
(45) Date of Patent: Jan. 29, 2008

(54) APPARATUS FOR DRYING SUBSTRATE AND METHOD THEREOF

(75) Inventors: Sang-Yong Kim, Yongin-si (KR);
Chang-Ki Hong, Seongnam-si (KR);
Sang-Jun Choi, Seoul (KR);
Woo-Gwan Shim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 11/158,912

(22) Filed: Jun. 22, 2005

(65) Prior Publication Data

US 2006/0042722 A1    Mar. 2, 2006

(30) Foreign Application Priority Data

Jun. 23, 2004    (KR) ...................... 10-2004-0047155

(51) Int. Cl.
*B65B 1/04* (2006.01)
(52) U.S. Cl. ......................................... 141/100; 118/42
(58) Field of Classification Search .................... 141/9, 141/100; 118/52, 56, 64, 66, 302, 313, 319, 118/321, 323; 427/240, 422, 425, 426
See application file for complete search history.

(56) References Cited

U.S. PATENT DOCUMENTS 5,942,035 A * 8/1999 Hasebe et al. ................ 118/52
6,858,091 B2 * 2/2005 Boyd et al. ................... 134/26

FOREIGN PATENT DOCUMENTS

| KR | 1999-0075167 | 10/1999 |
| KR | 10-2004-0015811 | 2/2004 |
| KR | 1020040028385 A | 4/2004 |

* cited by examiner

*Primary Examiner*—Steven O. Douglas
(74) *Attorney, Agent, or Firm*—F. Chau & Assoc., LLC

(57) ABSTRACT

An apparatus for drying a substrate using the Marangoni effect is disclosed. The apparatus includes a rotatable supporting portion on which a substrate is placed. A first nozzle for supplying de-ionized water and a second nozzle for supplying isopropyl alcohol vapor are provided on the supporting portion. When the isopropyl alcohol vapor is supplied to the center of the substrate at the initial stage, the amount of alcohol that reaches the substrate is controlled by a controlling portion such that the amount of the second liquid gradually increases.

14 Claims, 10 Drawing Sheets

APPARATUS FOR DRYING SUBSTRATE AND METHOD THEREOF

CROSS-REFERENCE TO RELATED APPLICATIONS

This patent application claims priority under 35 U.S.C. § 119 to Korean Patent Application 2004-47155 filed on Jun. 23, 2004, the entire contents of which are hereby incorporated by reference.

BACKGROUND OF THE INVENTION

The present invention relates to an apparatus for fabricating a semiconductor device and a method thereof and more particularly, to an apparatus for drying a semiconductor wafer using the Marangoni effect and a method thereof.

A process step for fabricating an integrated circuit on a semiconductor wafer requires cleaning the semiconductor wafer to remove residual chemicals, small particles, and contaminants generated during various fabricating processes. In particular, when a highly integrated circuit is fabricated, special attention is paid to the process of cleaning minute contaminants attached to the surface of the semiconductor wafer.

The process of cleaning the semiconductor wafer is divided into a chemical solution processing process (a liquid chemical processing process) for etching or separating the contaminants on the semiconductor wafer by chemical reaction, a rinsing process for rinsing the liquid chemical processed semiconductor wafer by pure water, and a drying process of drying the rinsed semiconductor wafer.

At an initial stage of semiconductor fabrication, a spin dryer using centrifugal force was used as a single wafer type dryer for the drying process. An example of the spin dryer is disclosed in U.S. Pat. No. 5,829,256. However, as the integrated circuit becomes increasingly complicated, it is difficult to completely remove minute water drops that remain on a wafer resulting from the centrifugal force of the spin dryer because a large number of water marks is generated on the wafer after the drying process.

To prevent water marks from generating on a wafer, a Marangoni dryer has recently been used. An example of the Marangoni dryer is disclosed in Japanese Patent Laid-Open Publication No. 10-335299. The Marangoni dryer is a device for performing the drying process using the Marangoni effect after accommodating wafers in a processing tub. Therefore, when the drying process is performed on a group of wafers, contaminants reside in the processing tub. But, the contaminants may contaminate a subsequent group of wafers on which the drying process is performed in the processing tub. In particular, when the entire liquid chemical processing process, rinsing process, and drying process are performed in one processing tub, the above-described problem becomes more severe.

SUMMARY OF THE INVENTION

An embodiment of the present invention provides a drying apparatus that comprises a rotational supporting portion on which a substrate is placed. A first supplying portion and a second supplying portion are provided on the supporting portion. The first supplying portion has a first nozzle for spraying first liquid to the substrate that is placed on the supporting portion. The second supplying portion has a second nozzle for spraying second liquid to the substrate that is placed on the supporting portion. For example, the first liquid is de-ionized water and the second liquid is alcohol vapor such as isopropyl alcohol. There is provided a controlling portion for controlling the second supporting portion by gradually increasing the amount of the second liquid reaching the substrate that is placed on the supporting portion.

The first nozzle and the second nozzle are simultaneously or respectively moved from the center of the substrate that is placed on the supporting portion to a side by a horizontally moving portion. The second nozzle is arranged to be closer to the center of the substrate that is placed on the supporting portion than the first nozzle during a drying process. According to an embodiment, the horizontally moving portion comprises a nozzle supporting rod with which the first nozzle and the second nozzle are combined and a driving portion for horizontally moving the nozzle supporting rod.

The second supplying portion further comprises a vapor generating portion for generating the alcohol vapor and a gas supplying pipe through which a carrier gas for carrying the alcohol vapor generated by the vapor generating portion to the second nozzle is supplied to the vapor generating portion and a vapor supplying pipe through which the alcohol vapor generated by the vapor generating portion is supplied to the second nozzle.

According to an embodiment, the controlling portion comprises a flow amount controller in the vapor supplying pipe to control the flow of the liquid that flows through the inside of the vapor supplying pipe, and a controller for controlling the flow amount controller in accordance with the point of time at which the drying process is performed.

According to another embodiment, the controlling portion comprises a flow amount controller in the gas supplying pipe to control the flow of the liquid that flows through the inside of the gas supplying pipe and a controller for controlling the flow amount controller in accordance with the point of time at which the drying process is performed.

According to another embodiment, the controlling portion comprises a vertically moving portion for vertically moving the second nozzle and a controller for controlling the vertically moving portion to control the distance between the substrate that is placed on the supporting portion to the second nozzle in accordance with the point of time where the drying process is performed.

In another embodiment, there is provided a method of drying a substrate, comprising the steps of placing a substrate on a supporting portion, rotating the supporting portion and spraying a first liquid having a surface tension from a first nozzle onto the substrate, spraying a second liquid having smaller surface tension than the surface tension of the first liquid from a second nozzle in a position closer to the center of the substrate than the first nozzle to the center of the substrate, and moving the first nozzle and the second nozzle such that the first liquid and the second liquid are gradually supplied from the center of the substrate to the edge thereof. The amount of the second liquid that reaches the center of the substrate at the initial stage gradually increases. Also, when the second nozzle is moved from the center of the substrate to the edge of the substrate, the amount of the second liquid that reaches the substrate remains the same.

According to an embodiment, the amount of the second liquid is controlled by controlling a flow amount controller in the vapor supplying pipe through which the second liquid is supplied to the second nozzle.

According to another embodiment, the second liquid comprises alcohol vapor. The amount of the second liquid is controlled by controlling a flow amount controller in the gas supplying pipe for supplying a carrier gas to a vapor generating portion to carry alcohol vapor generated by the vapor generating portion to the second nozzle.

According to another embodiment, the amount of the second liquid is controlled by moving the second nozzle downward such that the distance between the substrate and the second nozzle is gradually reduced.

BRIEF DESCRIPTION OF THE DRAWINGS

The accompanying drawings are included to provide a further understanding of the invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
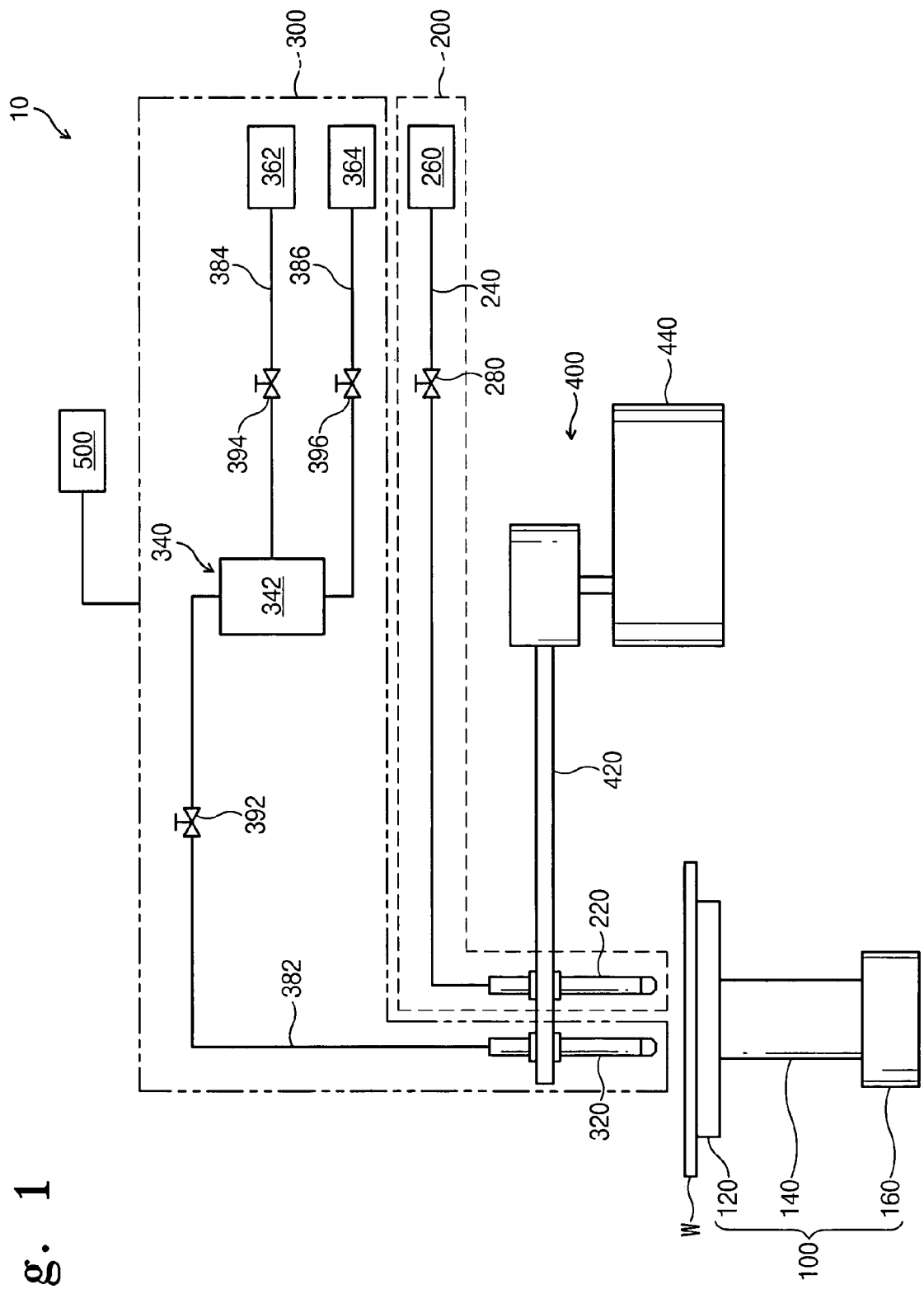
FIG. 1 schematically illustrates a drying apparatus according to an embodiment of the present invention.

Hereinafter, embodiments of the present invention will be described in more detail with reference to FIGS. 1 to 11.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

FIG. 1 schematically illustrates a drying apparatus according to a preferred embodiment of the present invention. Referring to FIG. 1, a drying apparatus 10 includes a supporting portion 100, a first supplying portion 200, a second supplying portion 300, a horizontally moving portion 400, and a controlling portion 500. A semiconductor substrate such as a wafer W is placed on the supporting portion 100 when processes are performed. The first supplying portion 200 supplies first liquid having a surface tension to the wafer W that is placed on the supporting portion 100. The second supplying portion 300 supplies a second liquid having surface tension different from the surface tension of the first liquid to the wafer W that is placed on the supporting portion 100. The horizontally moving portion moves nozzles 220 and 320 provided in the first supplying portion 200 and the second supplying portion 300, respectively, such that the first liquid and the second liquid are sequentially supplied from the center of the wafer W to the edge thereof. The controlling portion 500 controls the amount of the second liquid that reaches the center of the wafer W at the initial stage to minimize the amount of the water marks generated in the center of the wafer W.

According to an embodiment of the present invention, the supporting portion 100 has a disk-shaped supporting plate 120 on which the wafer W is placed. The supporting plate 120 is supported by a rotating shaft 140 and a driving portion 160, such as a motor, is connected to the rotating shaft 140 such that the supporting plate 120 rotates during processes. To prevent the wafer W that is placed on the supporting plate 120 from moving during rotation, the wafer W is fixed to the supporting plate 120 by vacuum means (not shown) or mechanical means (not shown) such as a clamp.

According to an embodiment of the present invention, the wafer W is dried by the Marangoni effect. According to the Marangoni effect, when two materials having different surface tensions co-exist on one surface, the material having smaller surface tension moves to the material having larger surface tension. The first supplying portion 200 and the second supplying portion 300 supply liquids having different surface tensions as described above to the surface of the wafer W. The first liquid supplied by the first supplying portion 200 has larger surface tension than the surface tension of the second liquid supplied by the second supplying portion 300. According to an embodiment, de-ionized water may be used as the first liquid, and liquid including alcohol vapor may be used as the second liquid. Isopropyl alcohol (IPA), ethylglycol, 1-propanol, 2-propanol, tetrahydrofurane, 4-hydroxy-4-methyl-2-pentanol, 1-butanol, 2-butanol, methanol, ethanol, acetone, n-propyl alcohol, and dimethylether may be used as alcohol.

The first supplying portion 200 includes the first nozzle 220 and a de-ionized water supplying pipe 240 that is a channel through which de-ionized water is supplied from a de-ionized water storage portion 260 to the first nozzle 220 is connected to the first nozzle 220. An opening and closing valve 280 for opening and closing the internal channel of the de-ionized water supplying pipe 240 and a flow amount controlling valve (not shown) for controlling the amount of the liquid that flows through the internal channels may be provided in the de-ionized water supplying pipe 240.

The second supplying portion 300 includes a vapor generating portion 340 and the second nozzle 320. The vapor generating portion 340 generates the IPA vapor, and the IPA vapor generated by the vapor generating portion 340 is supplied to the second nozzle 320 through a vapor supplying pipe 382. The vapor generating portion 340 has a body 342 in which IPA liquid is accommodated. A liquid supplying pipe 386 for supplying IPA liquid to the body 342 is connected to the bottom surface of the body 342. A gas supplying pipe 384 for supplying a carrier gas to the body 342 is connected to the side of the body 342. The carrier gas carries the IPA vapor generated in the vapor generating portion 340 to the second nozzle 320. An inert gas such as a nitrogen gas and argon (Ar) may be used as the carrier gas. A heater (not shown) is provided in the vapor generating portion 340 such that the IPA liquid is heated to generate the IPA vapor. A gas such as nitrogen is selectively supplied to the IPA liquid to generate the IPA vapor. The vapor supplying pipe 382, the gas supplying pipe 384, and the liquid supplying pipe 386 may include opening and closing valves 392, 394, and 396 for opening and closing the internal channels thereof, respectively.

At the initial stage, the first nozzle 220 and the second nozzle 320 are arranged above the center of the wafer W and are moved from the center of the wafer W to the edge thereof by the horizontally moving portion 400 during the drying process. The horizontally moving portion 400 has a supporting rod 420 with which the first nozzle 220 and the second nozzle 320 are combined. The supporting rod 420 is linearly moved by a driving portion 440 along the radius of the wafer W. A driving assembly including a motor may be used as the driving portion 440. For example, the driving assembly consists of a driving pulley driven by the motor, a driven pulley, a belt in which a bracket is provided, the belt for connecting the driving pulley and the driven pulley to each other, and a guide rail for guiding the linear motion of the bracket. The supporting rod 420 may be fixed to the bracket. As another embodiment, the driving assembly may include a rack and a pinion for converting rotary motion into linear motion. A hydraulic and pneumatic cylinder may be used as the driving portion 440. However, to precisely control transport speed, the driving portion including the motor as described above is preferably used as the driving portion 440.

Figure 2:
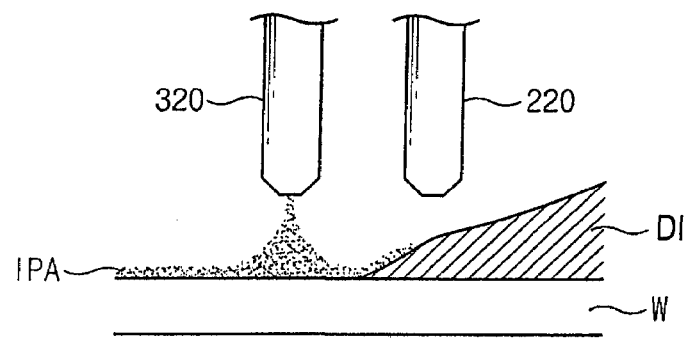
FIG. 2 illustrates a process of drying a wafer by the Marangoni effect according to an embodiment of the present invention.

The first nozzle 220 and the second nozzle 320 are combined with the supporting rod 420 in parallel in the radial direction of the wafer W. The second nozzle 320 is arranged so as to be closer to the end of the supporting rod 420 than the first nozzle 220. Due to the above-described structure, when the supporting rod 420 is moved from the center of the wafer W to the edge thereof, the second nozzle 320 is moved along with the first nozzle 220 while being always separated from the first nozzle 220 by a predetermined distance. Therefore, the IPA vapor having small surface tension is sprayed to the inner side of the wafer W rather than the de-ionized water having large surface tension. That is, the de-ionized water is first sprayed onto a predetermined region of the wafer W and then, the IPA vapor is sprayed. As illustrated in FIG. 2, the de-ionized water is pushed out to the edge of the wafer W due to the rotation of the wafer W and an IPA layer is formed on the residing de-ionized water. Since the material having small surface tension moves to the material having large surface tension in accordance with the Marangoni effect, the de-ionized water is moved to the edge of the wafer W. Accordingly, as the first nozzle 220 and the second nozzle 320 are moved to the edge of the wafer W, the de-ionized water is removed from the entire region of the wafer W and the volatile IPA liquid is vaporized such that the wafer W is completely dried.

According to the above-described embodiment, the first nozzle 220 and the second nozzle 320 are combined with one supporting rod 420 and the supporting rod 420 is moved by one driving portion 440. However, the supporting rod 420 with which the first nozzle 220 is combined and a supporting rod 420 with which the second nozzle 320 is combined are separately provided such that the supporting rods 420 are moved by separate driving portions, respectively.

When the drying process is performed using the above-described apparatus, the factors that affect the drying of the wafer W are the rotational speed of the wafer W, the transport speed of the first nozzle 220 and the second nozzle 320, and the amount of the liquid that is sprayed by the first nozzle 220 and the second nozzle 320 to reach the wafer W. While the first nozzle 220 and the second nozzle 320 are moved from the center of the wafer W to the edge thereof, the amount of the liquid that is sprayed by the first nozzle 220 and the second nozzle 320 to reach the wafer W may remain the same or be adjusted accordingly.

Figure 3:
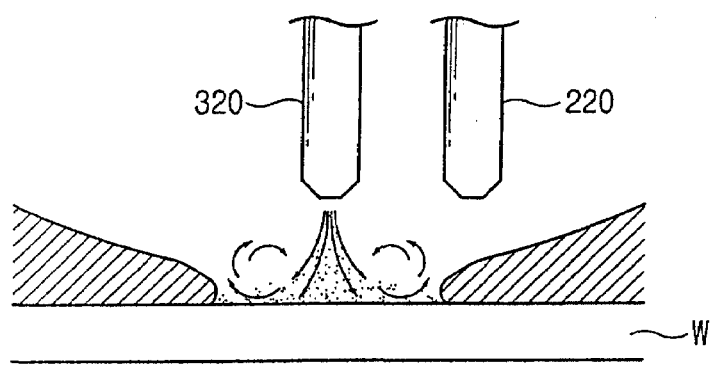
FIG. 3 illustrates the movement of de-ionized water in the center of a wafer when a large amount of isopropyl alcohol (IPA) vapor is supplied to the wafer at an initial stage according to an embodiment of the present invention.

The amount of the IPA vapor that reaches the center of the wafer W at the initial stage significantly affects the generation of the water marks in the center of the wafer W. As illustrated in FIG. 3, when a large amount of IPA vapor reaches the center of the wafer W at the initial stage, due to the sudden supply of the IPA vapor, turbulence is generated on the surface of the wafer W. Therefore, the de-ionized water is not moved from the center of the wafer W to the edge thereof only by the centrifugal force and the Marangoni effect but is also moved from the center of the wafer W to the edge thereof by the collision with the IPA vapor. Therefore, since the center of the wafer W is not dried by the Marangoni effect, a larger number of water marks are generated in the center of the wafer W than at the edge of the wafer W after the drying process is completed.

Figure 4A:
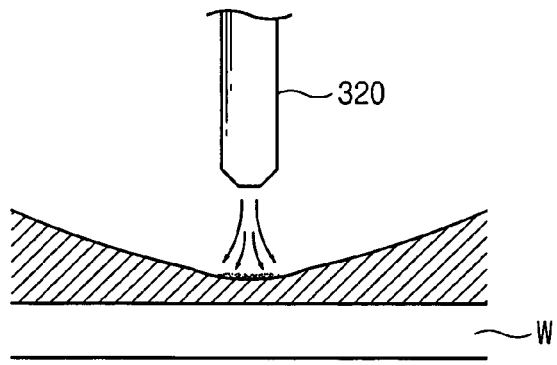
FIGS. 4A to 4C sequentially illustrate the movement of de-ionized water in the center of a wafer when the IPA vapor is supplied to the wafer at the initial state such that the IPA vapor gradually increases according to an embodiment of the present invention.
Figure 4B:
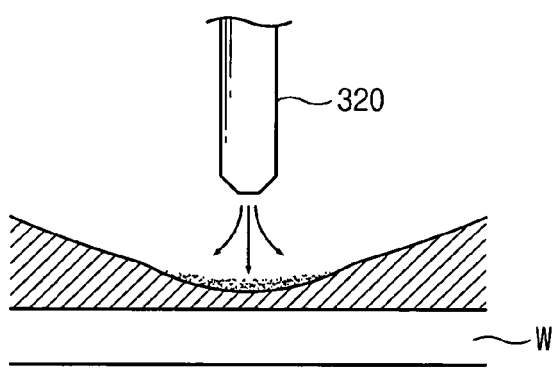
Figure 4C:
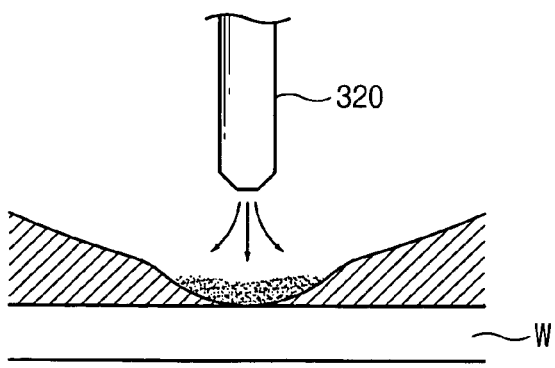
Figure 5A:
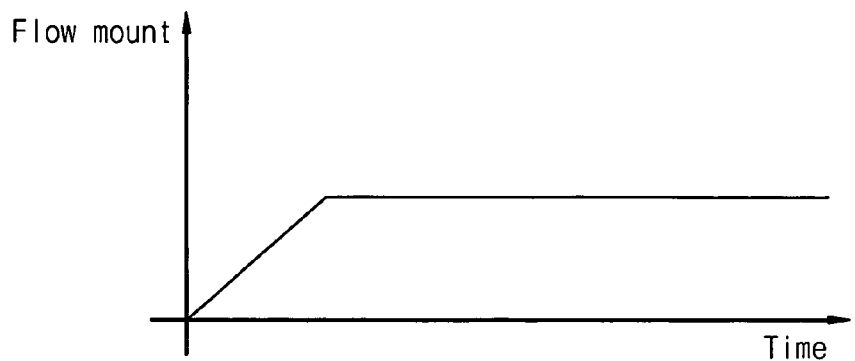
FIGS. 5A to 5C illustrate various examples of the amount of the IPA vapor that reaches the wafer W relative to time according to an embodiment of the present invention.
Figure 5B:
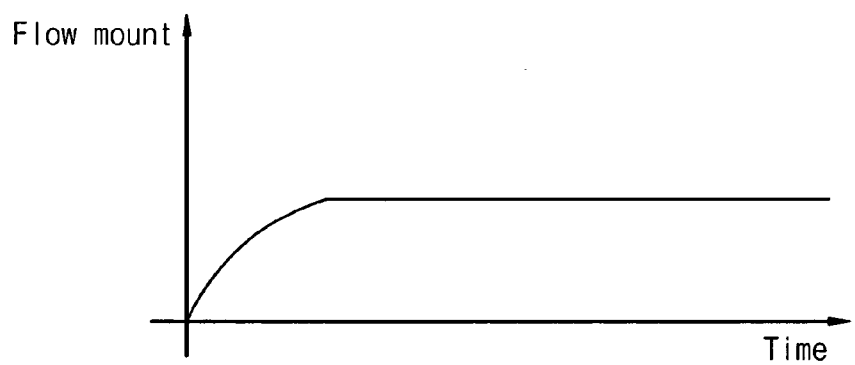
Figure 5C:
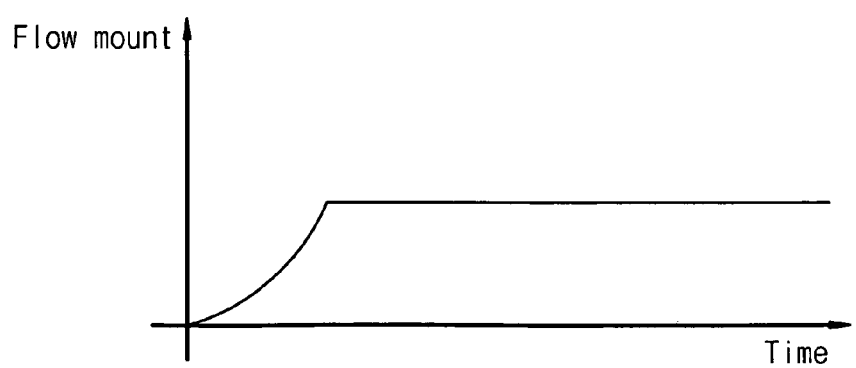

To prevent the water marks from being concentrated on the center of the wafer W, the drying apparatus 10 includes the controlling portion 500 for controlling the amount of the IPA vapor that reaches the center of the wafer W at the initial stage. The controlling portion 500 controls the second supplying portion 300 such that the amount of the IPA vapor that reaches the center of the wafer W gradually increases. Therefore, the de-ionized water is not instantaneously moved from the center of the wafer W, but is moved from the center of the wafer W by the centrifugal force and the Marangoni effect as illustrated in FIGS. 4A to 4C. FIGS. 5A to 5C illustrate various examples of the amount of the IPA vapor that reaches the wafer W in accordance with time. The first nozzle 220 and the second nozzle 320 may be moved after the amount of the IPA vapor reaches a predetermined value. The supporting rod 420 is selectively moved at the moment when the IPA vapor is sprayed. In such a case, the transport speed of the supporting rod 420 can be controlled.

Figure 6A:
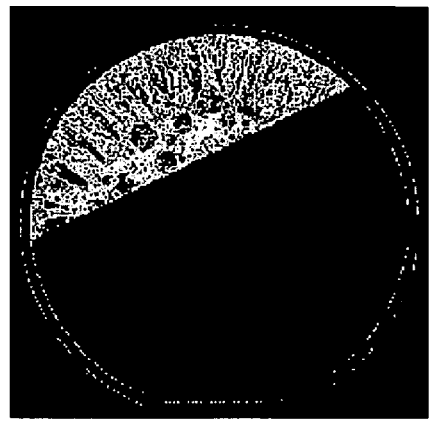
FIGS. 6A to 6C illustrate water marks generated on a wafer by using the drying apparatuses according to an embodiment of the present invention.
Figure 6B:
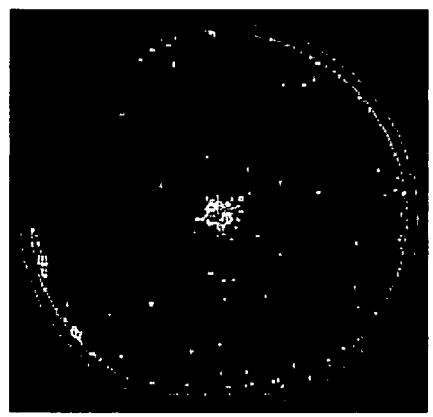
Figure 6C:
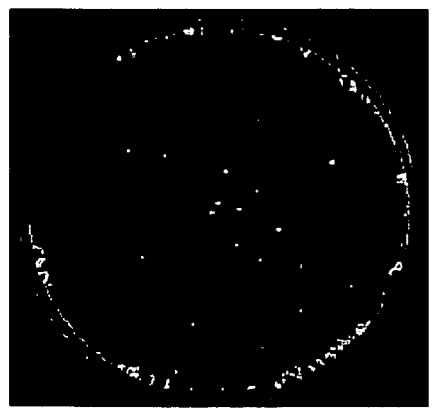

FIGS. 6A to 6C illustrate the water marks generated on the wafer W when the wafer W is dried by various methods. FIG. 6A illustrates the water marks generated when the drying process is performed using the spin dryer. FIG. 6B illustrates the water marks generated when the drying process is performed using the drying apparatus of FIG. 1 in a state where the amount of the IPA vapor that reaches the wafer W at the initial stage is not controlled. FIG. 6C illustrates the water marks generated when the drying process is performed using the drying apparatus of FIG. 1 in a state where the amount of the IPA vapor that reaches the wafer W at the initial stage is controlled. When the spin dryer is used, no less than about 100,000 water marks are found on the wafer W. When the drying apparatus of FIG. 1 is used in the state where the amount of the IPA vapor is not controlled, about 1,500 water marks are found on the wafer W. In such a case, a large number of water marks are concentrated on the center of the wafer W. However, when the drying process is performed using the drying apparatus of FIG. 1 while controlling the amount of the IPA vapor that reaches the wafer W at the initial stage, about 300 water marks are found on the wafer W and the water marks are not concentrated on the center of the wafer W.

Figure 7:
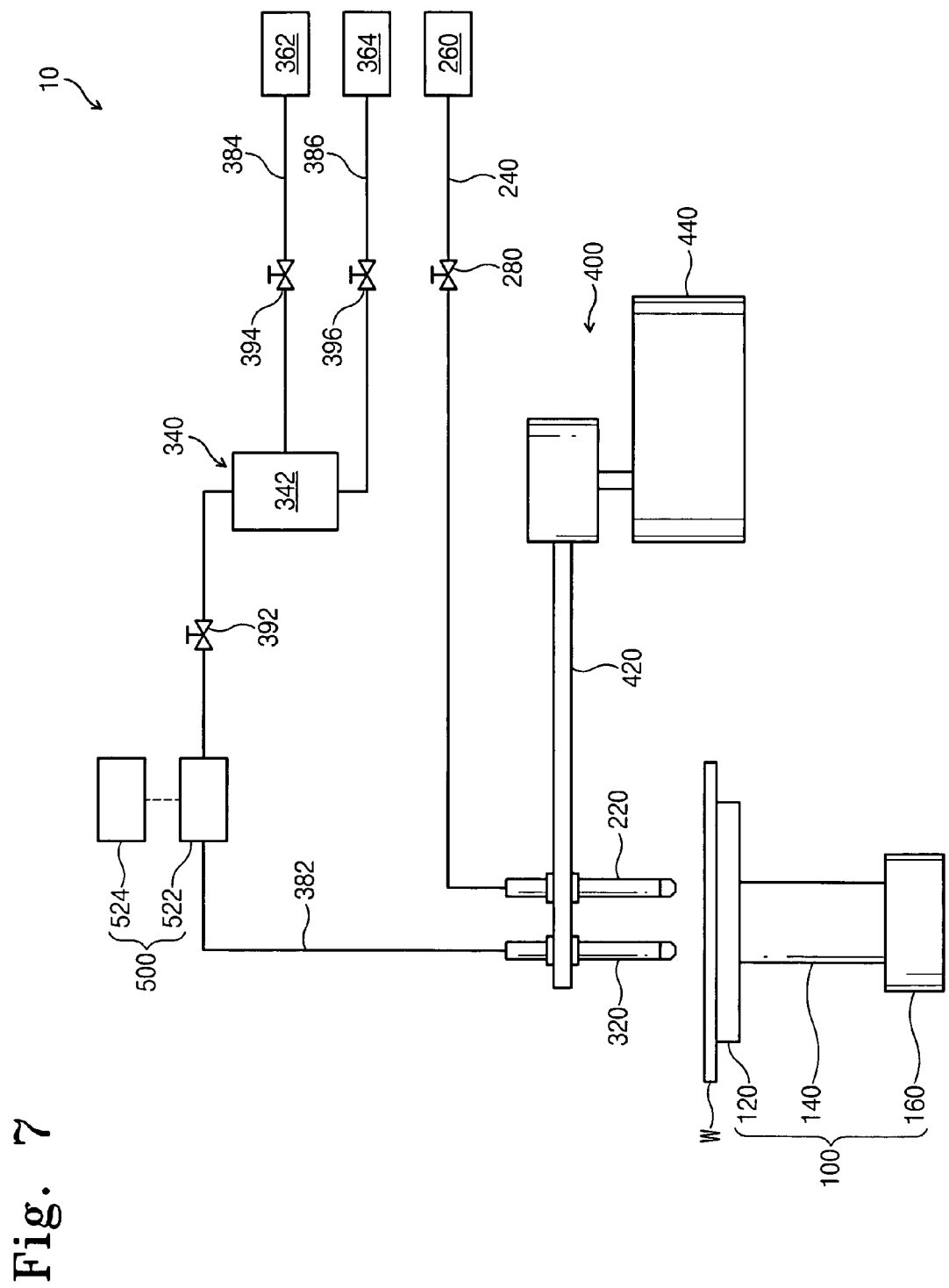
FIG. 7 illustrates a drying apparatus using a controlling portion according to an embodiment of the present invention.

FIG. 7 schematically illustrates another embodiment of a drying apparatus in which an example of the controlling portion 500 is illustrated. Referring to FIG. 7, the controlling portion 500 controls the amounts of the IPA vapor and the carrier gas that are supplied to the second nozzle 320 through the vapor supplying pipe 382. To control the amounts of the IPA vapor and the carrier gas, the controlling portion 500 has a flow amount controller 522 in the vapor supplying pipe 382 to control the amount of the liquid that flows through the inside of the vapor supplying pipe 382 and a controller 524 for controlling the flow amount controller 522. A flow amount controlling valve may be used as the flow amount controller 522. Since the amount of the second liquid supplied to the second nozzle 320 is proportionate to how wide the valve is opened, the controller 524 controls the flow amount controlling valve 522 for gradually opening at the initial stage.

Figure 8:
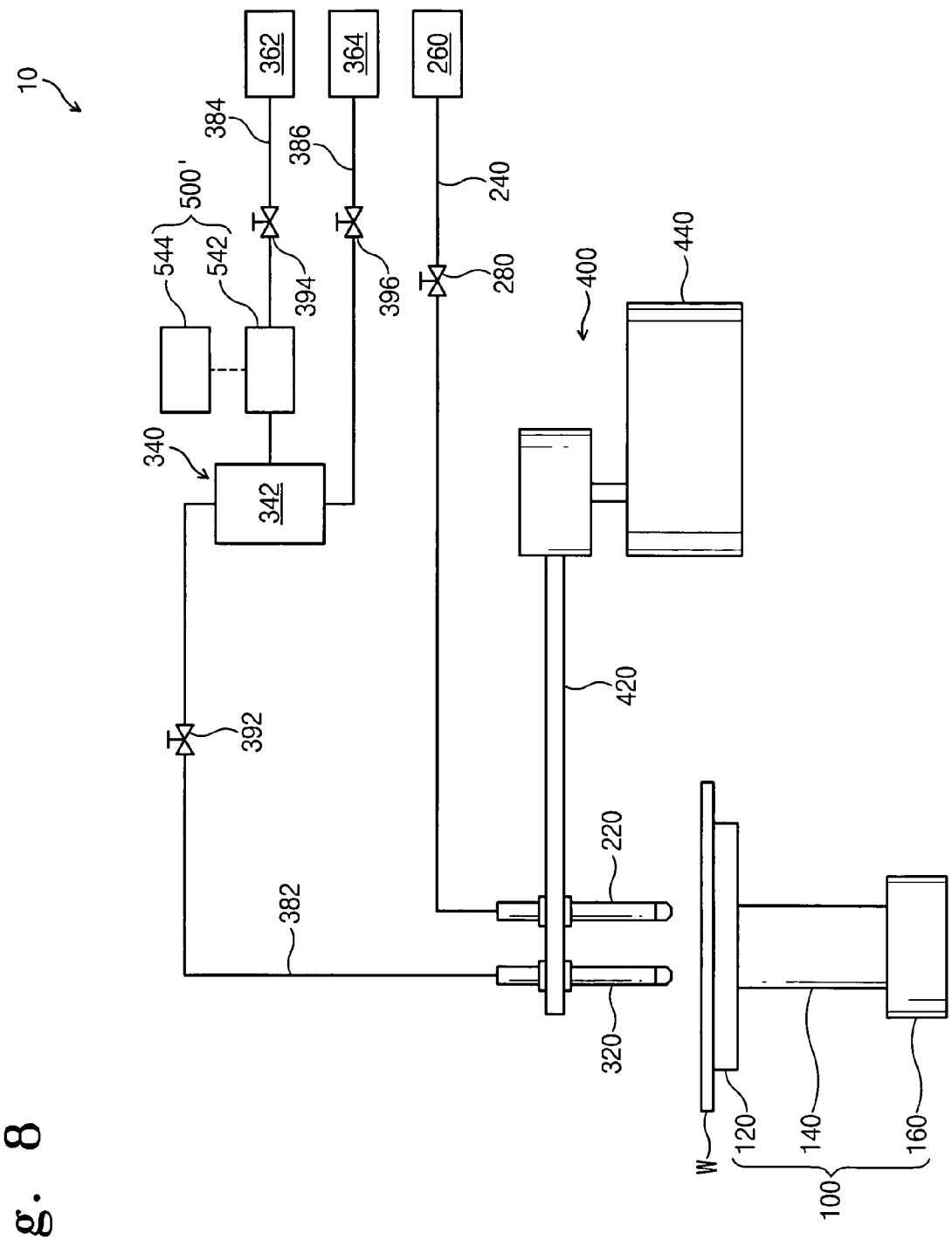
FIG. 8 illustrates a drying apparatus using the controlling portion according to an embodiment of the present invention.

FIG. 8 schematically illustrates another embodiment of the drying apparatus 10 in which another example of a controlling portion 500' is illustrated. Referring to FIG. 8, the controlling portion 500' controls the amount of the carrier gas supplied to the vapor generating portion 340 to carry the IPA vapor to the second nozzle 320. To control the amount of the carrier gas, the controlling portion 500' has a flow amount controller 542 in the gas supplying pipe 384 to control the amount of the carrier gas that flows through the inside of the gas supplying pipe 384 and a controller 544 for controlling the flow amount controller 542. A flow amount controlling valve may be used as the flow amount controller 542. Since the amount of the second liquid supplied to the second nozzle 320 is proportionate to the amount of the carrier gas supplied to the vapor generating portion 340, the controller 544 controls the flow amount controlling valve for gradual opening at the initial stage.

Figure 9:
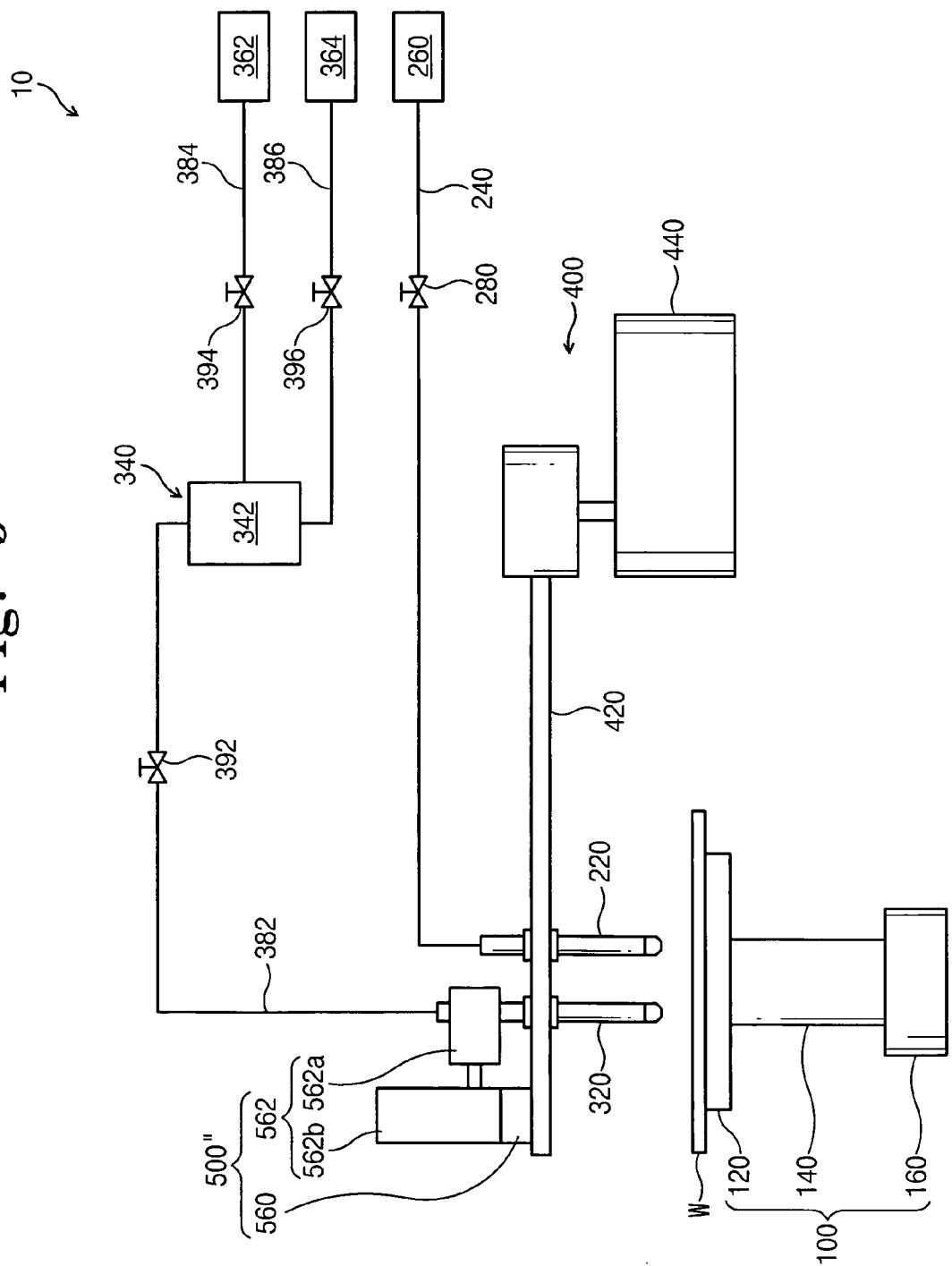
FIG. 9 illustrates a drying apparatus using the controlling portion according to an embodiment of the present invention.

FIG. 9 schematically illustrates another embodiment of the drying apparatus 10 in which another example of a controlling portion 500" is illustrated. Referring to FIG. 9, the controlling portion 500" controls the amount of the second liquid that reaches the wafer W by changing the height of the second nozzle 320. Since the second liquid includes the IPA vapor and the carrier gas, the closer the second nozzle 320 is to the wafer W, the amount of the second liquid that reaches the wafer W increases.

Figure 10:
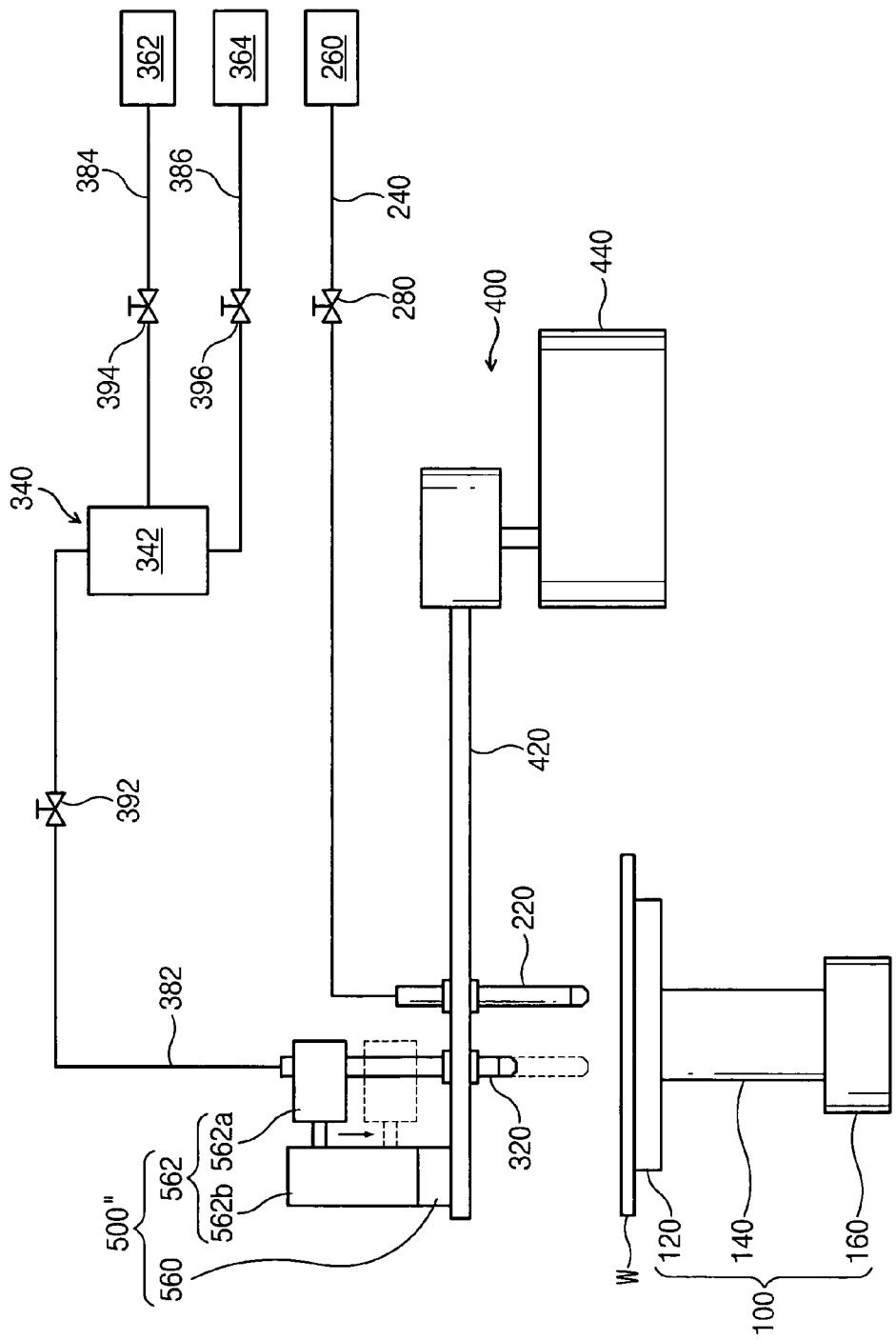
FIG. 10 illustrates the movement of a second nozzle from the initial position to a process position in the drying apparatus of FIG. 9 according to an embodiment of the present invention.

Referring to FIG. 10, which schematically illustrates another embodiment of the drying apparatus 10 in which another example of the controlling portion 500" is illustrated, the second nozzle 320 is high above the wafer W to have initial height at the initial stage where the IPA vapor starts to be sprayed and gradually moves downward until the second nozzle 320 has process height. In FIG. 10, the solid line represents the second nozzle 320 positioned having the initial height and the dotted line represents the second nozzle 320 positioned having the process height.

Therefore, the controlling portion 500" has a vertically moving portion 562 for vertically moving the second nozzle 320 from the initial height to the process height. The vertically moving portion 562 is controlled by a controller 560. The vertically moving portion 562 includes a supporting rod 562a with which the second nozzle 320 is combined and a driving portion 562b for vertically and linearly moving the supporting rod 562a. A driving portion that has a similar structure to the structure of the driving portion of the horizontally moving portion 400 may be used as the driving portion 562b. However, to precisely control the position, a driving assembly in which a motor is used is preferably used as the driving portion 562b. Mechanical mechanisms having various structures commonly used for vertically moving the nozzle may be selectively used as the driving portion 562b.

According to above-described embodiments, the controlling portion 500 was described to use one among the flow amount controlling valve 522 provided in the vapor supplying pipe 382, the flow amount controlling valve 542 provided in the gas supplying pipe 384, and the vertically moving portion 562. However, the controlling portion 500 may use a combination of a plurality of means among the above-described means and may use various means different from the above-described means to control the amount of the liquid that reaches the wafer W.

Figure 11:
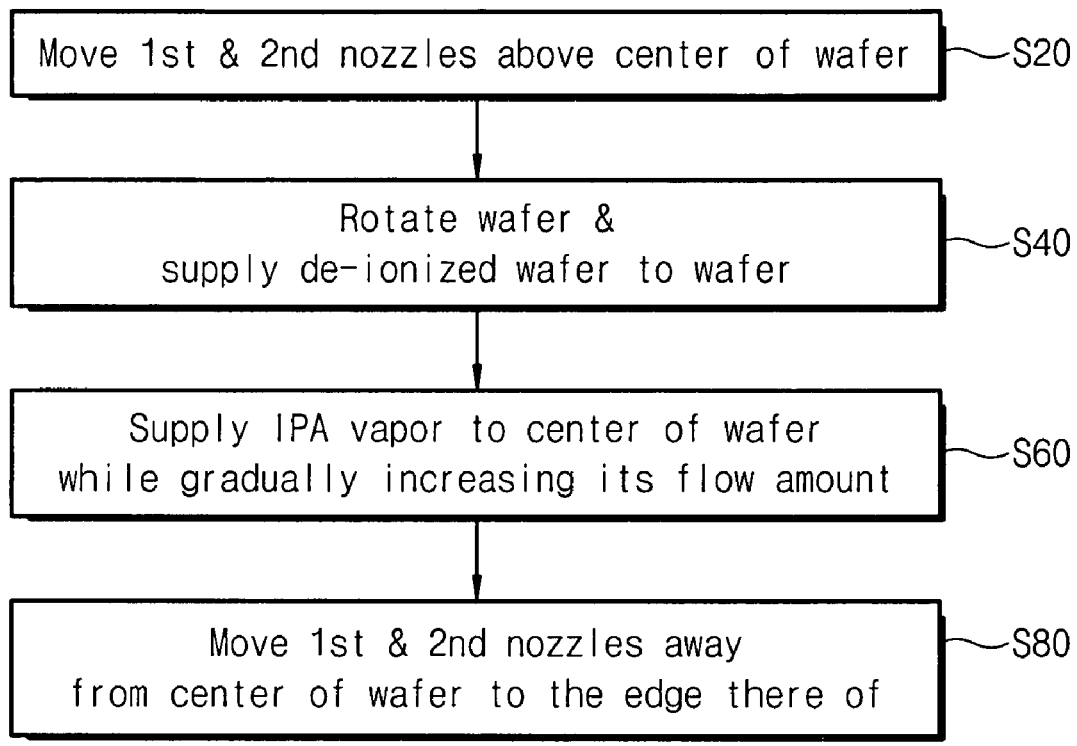
FIG. 11 is a flowchart sequentially illustrating a drying method according to a preferred embodiment of the present invention.

Next, processes of drying the wafer W are sequentially illustrated with reference to FIG. 11. First, the wafer W to be dried is placed on the supporting plate 120 by a transfer arm. The supporting rod 420 is moved such that the first nozzle 220 and the second nozzle 320 are positioned above the center of the wafer W in S20. The opening and closing valve 280 provided in the de-ionized water supplying pipe 240 is opened such that de-ionized water is continuously supplied onto the wafer W through the first nozzle 220 in S40. The IPA vapor is generated from the IPA liquid in the vapor generating portion 340 and a carrier gas is supplied to the vapor generating portion 340. The IPA vapor is supplied to the second nozzle 320 through the vapor supplying pipe 382 by the carrier gas and the IPA vapor is sprayed from the second nozzle 320 to the center of the wafer W. At the initial stage, the amount of the IPA vapor that reaches the wafer W is controlled to gradually increase its flow amount in S60. The amount of the IPA vapor is controlled by providing the flow amount controllers 522 and 542 such as the flow amount controlling valve in the vapor supplying pipe 382 or the gas supplying pipe 384 and by controlling the valve to be gradually opened. The amount of the IPA vapor is selectively controlled by gradually moving the second nozzle 320 downward from the initial height to the process height. Then, the first nozzle 220 and the second nozzle 320 are moved away from the center of the wafer W to the edge thereof in the radial direction of the wafer W such that the wafer W is dried in S80.

According to an embodiment of the present invention, since a processing tub is not used, it is possible to prevent a wafer from being re-contaminated. Also, since the wafer is dried using the Marangoni effect, it is possible to minimize water marks generated on the wafer.

Also, according to an embodiment of the present invention, the amount of the IPA vapor supplied to the wafer at the initial stage gradually increases such that the drying process is stably performed in the center of the wafer due to the Marangoni effect. Therefore, it is possible to prevent water marks from being concentrated on the center of the wafer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for drying a substrate comprising:
  a rotational supporting portion on which a substrate is placed;
  a first supplying portion having a first nozzle for spraying a first liquid having a surface tension to the substrate that is placed on the supporting portion;

a second supplying portion comprising:
- a second nozzle for spraying second liquid having a smaller surface tension than the surface tension of the first liquid to the substrate that is placed on the supporting portion, wherein the second liquid comprises alcohol vapor;
- a vapor generating portion generating the alcohol vapor; a gas supplying pipe through which a carrier gas for carrying the alcohol vapor generated by the vapor generating portion to the second nozzle is supplied to the vapor generating portion; and
- a vapor supplying pipe through which the alcohol vapor generated by the vapor generating portion is supplied to the second nozzle; and
- a controlling portion for controlling the second supplying portion such that the amount of the second liquid reaching the center of the substrate that is placed on the supporting portion gradually increases.

2. The drying apparatus as set forth in claim 1, wherein the drying apparatus further comprises a horizontally moving portion for simultaneously or respectively moving the first nozzle and the second nozzle from the center to one side of the substrate that is placed on the supporting portion.

3. The drying apparatus as set forth in claim 2, wherein the second nozzle is arranged to be closer to the center of the substrate that is placed on the supporting portion than the first nozzle during a drying process.

4. The drying apparatus as set forth in claim 3, wherein the horizontally moving portion comprises:
- a nozzle supporting rod which combines the first nozzle and the second nozzle; and
- a driving portion horizontally moving the nozzle supporting rod.

5. The drying apparatus as set forth in claim 1, wherein the controlling portion comprises:
- a flow amount controller provided in the vapor supplying pipe to control the flow amount of the liquid that flows through the inside of the vapor supplying pipe; and
- a controller for controlling the flow amount controller in a accordance with the point of time at which the drying process is performed.

6. The drying apparatus as set forth in claim 1, wherein the controlling portion comprises:
- a flow amount controller provided in the gas supplying pipe to control the flow of the liquid through the inside of the gas supplying pipe; and
- a controller for controlling the flow amount controller in accordance with the point of time at which the drying process is performed.

7. The drying apparatus as set forth in claim 1, wherein the controlling portion comprises:
- a flow amount controller provided in a vapor supplying pipe through which the second liquid is supplied to the second nozzle; and
- a controller for controlling the flow amount controller.

8. The drying apparatus as set forth in claim 1, wherein the controlling portion comprises:
- a vertically moving portion for vertically moving the second nozzle; and
- a controller for controlling the vertically moving portion to control the distance between the substrate that is placed on the supporting portion and the second nozzle in accordance with the point of time where the drying process is performed.

9. The drying apparatus as set forth in claim 1, wherein the first liquid comprises de-ionized water, and wherein the second liquid comprises isopropyl alcohol.

10. A method of drying a substrate, comprising the steps of:
- placing a substrate on a supporting portion;
- rotating the supporting portion and spraying a first liquid having a surface tension from a first nozzle onto the substrate;
- spraying a second liquid having a smaller surface tension than the surface tension of the first liquid from a second nozzle closer to the center of the substrate than from the first nozzle to the center of the substrate; and
- moving the first nozzle and the second nozzle such that the first liquid and the second liquid are gradually supplied from the center of the substrate to the edge thereof,
- wherein the amount of the second liquid that reaches the center of the substrate at an initial stage gradually increases,
- wherein the second liquid comprises alcohol vapor, and
- wherein the amount of the second liquid is controlled by controlling a flow amount controller in a qas supplying pipe for supplying a carrier gas to a vapor generating portion to carry alcohol vapor generated by the vapor generating portion to the second nozzle.

11. The method as set forth in claim 10, comprising controlling the amount of the second liquid by controlling a flow amount controller provided in a vapor supplying pipe through which the second liquid is supplied to the second nozzle.

12. The method as set forth in claim 10, comprising controlling the amount of the second liquid that is sprayed on the substrate by moving the second nozzle downward, thereby gradually reducing the distance between the substrate and the second nozzle.

13. The method as set forth in claim 10, comprising moving the second nozzle from the center of the substrate to the edge of the substrate, while maintaining uniform the amount of the second liquid that reaches the substrate.

14. The method as set forth in claim 10, wherein the first liquid comprises de-ionized water, and wherein the second liquid comprises isopropyl alcohol.

* * * * *